United States Patent
Velichko et al.

(10) Patent No.: US 9,182,490 B2
(45) Date of Patent: Nov. 10, 2015

(54) VIDEO AND 3D TIME-OF-FLIGHT IMAGE SENSORS

(71) Applicant: Semiconductor Components Industries, LLC, Phoenix, AZ (US)

(72) Inventors: Sergey Velichko, Boise, ID (US); Gennadiy Agranov, San Jose, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 14 days.

(21) Appl. No.: 14/092,611

(22) Filed: Nov. 27, 2013

(65) Prior Publication Data

US 2015/0144790 A1 May 28, 2015

(51) Int. Cl.
*G01B 11/24* (2006.01)
*G01S 17/08* (2006.01)
*H01L 27/148* (2006.01)

(52) U.S. Cl.
CPC ............ *G01S 17/08* (2013.01); *H01L 27/14875* (2013.01)

(58) Field of Classification Search
CPC ........... G06T 2207/10028; G06T 2207/10048; H01L 27/14609; H01L 27/14612
USPC ...................................................... 250/338.4
See application file for complete search history.

(56) References Cited

U.S. PATENT DOCUMENTS

| 7,436,496 B2* | 10/2008 | Kawahito | 356/5.01 |
| 2008/0231737 A1* | 9/2008 | Weale et al. | 348/308 |
| 2013/0026384 A1* | 1/2013 | Kim et al. | 250/393 |

FOREIGN PATENT DOCUMENTS

| EP | 2148514 | 1/2010 |
| EP | 2395370 | 12/2011 |
| EP | 2442135 | 4/2012 |
| EP | 2477043 | 7/2012 |
| WO | 2010013779 | 2/2010 |
| WO | 2013010913 | 1/2013 |
| WO | 2013106209 | 7/2013 |

OTHER PUBLICATIONS

Kim et al., U.S. Appl. No. 13/278,019, filed Oct. 20, 2011.

* cited by examiner

*Primary Examiner* — Marcus Taningco
(74) *Attorney, Agent, or Firm* — Treyz Law Group; Jason Tsai

(57) ABSTRACT

Electronic devices may include time-of-flight (ToF) image pixels. Each ToF pixel may include a photodiode, a first capacitor coupled to the photodiode via a first transfer gate, a second capacitor coupled to the photodiode via a second transfer gate, and a third capacitor coupled to the photodiode via a third transfer gate. The first transfer gate may be turned on for a given duration to store a first charge in the first capacitor. The second transfer gate may be turned on for the given duration to store a second charge in the second capacitor. The third transfer gate may be turned on for a duration that is longer than the given duration to store a third charge in the third capacitor. Depth information may be computed based on the first, second, and third stored charges and a corresponding pixel constant.

17 Claims, 5 Drawing Sheets

VIDEO AND 3D TIME-OF-FLIGHT IMAGE SENSORS

BACKGROUND

This-relates generally to imaging devices, and more particularly, to imaging devices that measure the flight time of reflected light pulses.

Image sensors are commonly used in electronic devices such as cellular telephones, cameras, and computers to capture images. In a typical arrangement, an electronic device is provided with an image sensor and a corresponding lens. Some electronic devices use arrays of image sensors and corresponding lenses to gather image data. This type of system, which is sometimes referred to as an array camera, may be used to capture depth information from a scene using a parallax effect based on a known physical offset between image sensors.

Depth information such as information about the distance of an object from an electronic device is also commonly captured using a dedicated range finder such as a radar system. In a typical range finder, light of a known frequency is emitted from the range finder in the direction of an object and is reflected off of the object in the direction of the range finder. Range finders typically have a light sensor that detects the reflected light. Distance information is then determined based on the time-of-flight of the light between the emission and detection of the light and the known speed of light.

Time-of-flight distance information is also sometimes extracted by a range finder from an emitted and reflected pulse of light by synchronizing the emission and the detection of the light. The light sensor is often configured to collect light for a predetermined amount of time alter the emission of the light. Light reflected from a far away object may not return during the light collection period while light reflected from a nearby object may return and be collected during the light collection period. This is because the light reflected from the far away object travels a longer distance and therefore has a longer time-of-flight. However, reflected intensity of emitted light most often is very small compared to natural background scenery intensity. Oftentimes the intrinsic brightness of objects in a typical real-world scene is hundreds or thousands of times more intense than the brightness of the reflected emitter-light pulse. Difficulties that arise in separating background intensity from reflected light pulse intensity can therefore be problematic when capturing images with depth information. In an effort to reduce background interference, some imaging devices operate only in the infrared (IR) range utilizing IR emitters and narrow band IR filters. Operating only in the IR range, however, prevents an imaging device from producing any color information.

It would therefore be desirable to be able to provide improved imaging devices for capturing depth information and color image at the same time.

DETAILED DESCRIPTION

Digital camera modules are widely used in electronic devices such as digital cameras, computers, cellular telephones, or other electronic devices. These electronic devices may include image sensors that gather incoming light to capture an image. The image sensors may include arrays of Image pixels. The image sensors may include arrays of time-of-flight image pixels for sensing the flight time of a light pulse emitted by a non-visible-light emitting component of the electronic device and reflected from an object. Image sensors may, if desired, include both image pixels and time-of-flight image pixels. Image pixels and time-of-flight image pixels in the image sensors may include photosensitive elements such as photodiodes that convert the Incoming light into electric charges.

Time-of-flight image sensor pixels may include one or more charge storage regions for storing charges collected using photosensitive elements. Time-of-flight image sensors may include a non-visible-light emitting component that emits light, which is then reflected off of objects in a scene. Charges generated by the reflected light may be converted into depth-image data. The depth-image data may be processed to form depth images (i.e., images in which the image data in each pixel of the image represents the distance to the object in that pixel). Image sensors may have any number of pixels such as image pixels and/or time-of-flight image pixels (e.g., hundreds or thousands or more). A typical image sensor may, for example, have hundreds of thousands or millions of pixels (e.g., megapixels).

Figure 1:
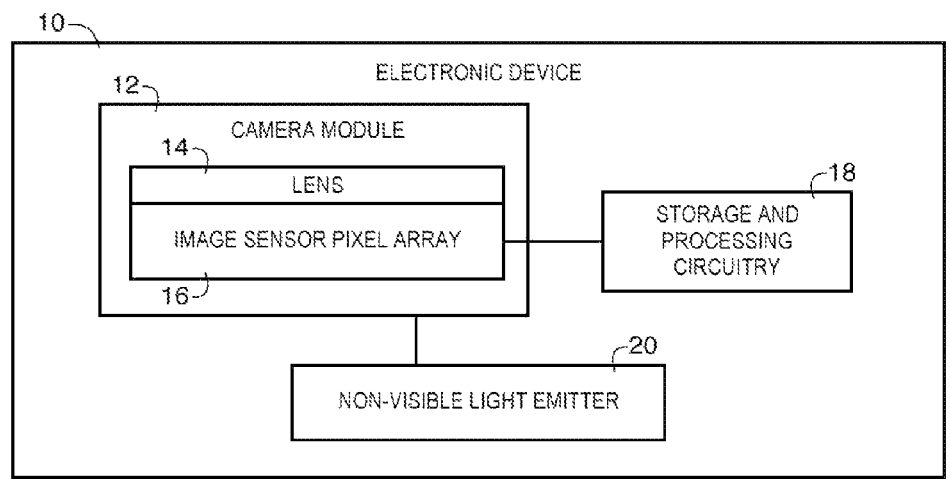
FIG. 1 is a diagram of an illustrative electronic device in accordance with an embodiment of the present invention.

FIG. 1 is a diagram of an illustrative electronic device that includes time-of-flight image pixels and a light pulse emitter for capturing depth images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include lens 14 and a corresponding image sensor pixel array 16. Lens 14 and the array 16 may be mounted in a common package and may provide image data to control circuitry such as storage and processing circuitry 18.

Electronic device 10 may include one or more light emitting components such as visible light source such as a camera flash or LED light source (not shown) and a non-visible-light pulse emitter (e.g., an infrared illuminator, a radio pulse emitter, or other source non-visible light capable of generating pulses of non-visible light) such as non-visible light emitter 20. Non-visible-light-emitter 20 (sometimes called light pulse emitter, pulse emitter, infrared emitter, emitter, etc.) may be used to emit a pulse of, for example, infrared light.

Light emitted by emitter 20 may be reflected off of objects in a real-world scene and detected using image sensor pixel array 16 of camera module 12. Circuitry 18 may be used to extract depth information (e.g., information about the distance of objects in a scene) from detected, reflected portions of light emitted by pulse emitter 20.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image pixel array 16 or an integrated circuit within module 12 that is associated with image, pixel array 16). Image data that has been captured by camera module 12 may be processed and stored using circuitry 18. Processed image data may, if desired, be provided to external equipment (e.g.,.. a computer or other device) using wired and/or wireless communications paths coupled to processing circuitry 18.

Figure 2:
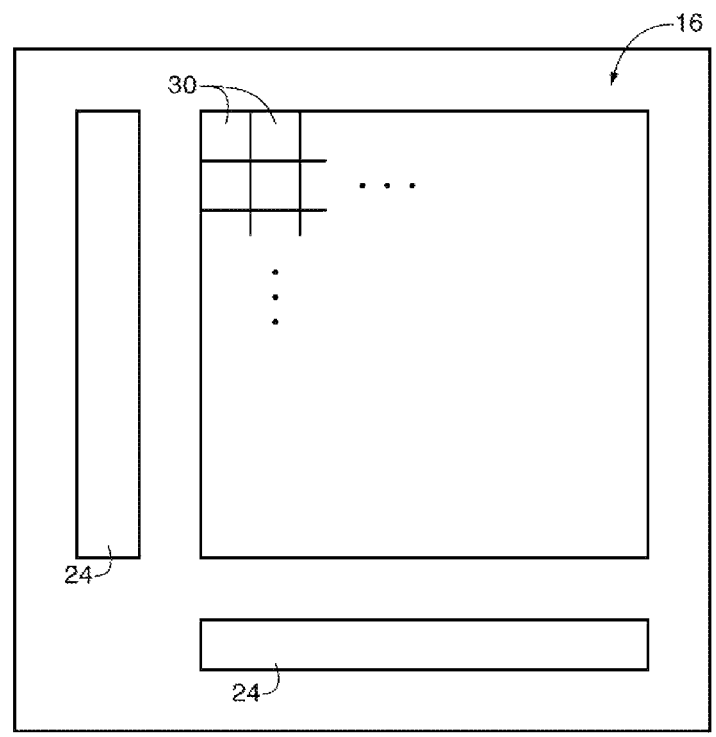
FIG. 2 is a top view of an illustrative image sensor pixel array in accordance with an embodiment of the present invention.

As shown in FIG. 2, image sensor pixel array 16 may contain an array of individual time-of-flight pixels such as image sensor pixels 30. This is merely illustrative. In general, array 16 may have any suitable number of image pixels, including mono and color time-of-flight pixels. For example, image pixel array 16 may be a Video Graphics. Array (VGA), sensor with a resolution of 480×640 sensor pixels (as an example). Image pixel array 16 with greater than VGA resolution or less than VGA resolution may be used.

A time-of-flight image sensor may be used to capture depth-image light for generating depth information about a real-world scene. Depth-image data may be captured in the form of electric charges generated by photosensors such as photodiodes in time-of-flight image pixels 30. These depth-image charges may be generated by detected portions of light emitted by emitter 20 of FIG. 1 and reflected from objects in a real-world scene.

Processing circuitry 18 (e.g., processing circuitry integrated onto sensor pixel array integrated circuit 16 and/or processing circuitry on one or more associated integrated circuits) may use signals from the time-of-flight pixel 30 output signals associated with reflected image light to determine the distance to the object in the field-of-view of each time-of-flight image pixel 30. Time-of-flight image pixels 30 in image sensor pixel array 16 may include multiple charge storage regions configured to store charges associated with reflected portions of light that was generated by emitter 20 and by background fight.

Color image data may be extracted from color background of captured light in time-of-flight pixel 30. For this purpose each time-of-flight image pixel 30 may be covered with a color fitter (e.g., red, green, blue, or other color filter).

Processing circuitry 18 (e.g., processing circuitry integrated onto sensor pixel array integrated circuit 16 and/or processing circuitry on one or more associated integrated, circuits) may also combine color image data (e.g., red, green, blue or other color image data) with depth-image data to form a three-dimensional color image of a scene. In some modes of operation, all of the image pixels on array 16 may be active (e.g., when determining 3-dimensional image depth information). In other modes of operation (e.g., color imaging), only a subset of the image pixels may be used. Other pixels may be inactivated to conserve power (e.g., their positive power supply voltage terminals may be taken to a ground voltage or other suitable power-down voltage and their control circuits may be inactivated or bypassed).

If desired, camera module 12 may include a single image sensor array with time-of-flight image pixels 30. If desired, camera module 12 may include one or more image sensor arrays each having a mix of conventional image pixels and time-of-flight image pixels 30. However, this is merely illustrative. If desired, each part of image sensor array 16 may include exclusively conventional image pixels or exclusively time-of-flight image pixels 30.

Image sensor pixel array 16 may also include circuitry such as support circuitry 24 (e.g., row select and control driver circuitry). Support circuitry 24 may be used to issue reset signals, row select signals, etc. for the image pixels and time-of-flight image pixels 30. Support circuitry 24 may likewise be used for reading out image data and depth-image data along output lines associated with time-of-flight image pixels and image data along output lines associated with conventional image pixels respectively.

Figure 3:
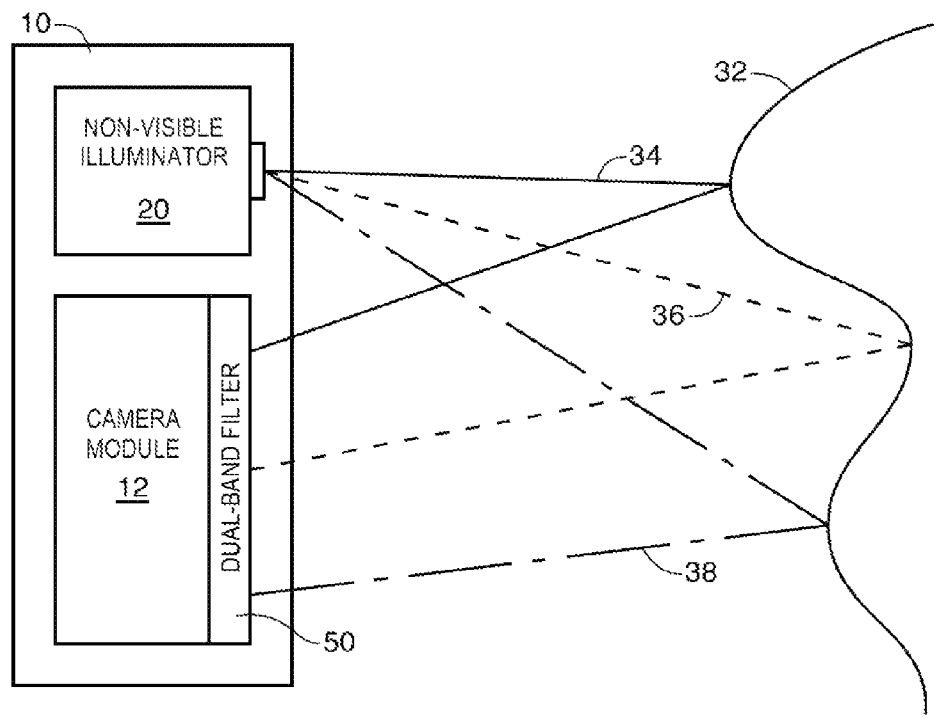
FIG. 3 is a diagram of an illustrative electronic device of the type shown in FIG. 1 showing how light may be reflected from objects at various distances in accordance with an embodiment of the present invention.

Time-of-flight image pixels 30 may be configured to receive light reflected from objects in a real-world scene as shown in FIG. 3. In the example of FIG. 3, a light pulse emitter such as Infrared (IR) illuminator 20 may be configured to emit one or more pulses of for example, infrared light that are synchronized with the time-of-flight pixel 30 operation. Camera module 12 may be configured to receive a portion of the emitted light pulse that is reflected, from multiple objects in a real-world scene 32. As shown in FIG. 3, portions of the emitted light pulse may travel from emitter 20 to the objects at various distances in scene 32 along paths such as paths 34, 36, and 38. In general, light pulses that are reflected off of farther objects will take a longer period of time to reach image sensor array 16 than pulses that are reflected off closer objects (e.g., the time-of-flight for path 36 will be longer than that of path 34 or 38).

Time-of-flight image pixels 30 may be configured to sense relative differences in the time-of-flight of returning portions of the emitted light pulse by sensing how much of returning portions return within a predetermined light collection period synchronized with IR illuminator 20 operation. In particular, time-of-flight image pixels 30 may be configured to sense how much of returning portions of the emitted light pulse return within a predetermined light collection period by determining the relative quantity of light sensed by time-of-flight image pixels 30. However, variations in intrinsic brightness of objects in a scene due to variations in object color and illumination may be problematic when extracting information about the how much of returning portions of the emitted light pulse return within the predetermined light collection period.

For example, a real-world scene may contain other objects such as background objects that may be illuminated by light sources other than emitter 20 such as external light source such as the Sun, the Moon, a flame, an indoor or outdoor electric light (e.g., an incandescent or fluorescent) or other light source or combination of light sources. Variations in intrinsic brightness of the objects in scene 32 due to variations in color and illumination may cause differences in the quantity of light received by camera module 12 of device 10 that are unrelated to differences in distance. In an embodiment of the present invention, time-of-flight image pixels 30 may fee configured to partially or completely remove intrinsic brightness (e.g., background light) from reflected portions of a light pulse emitted by emitter 20.

Figure 4:
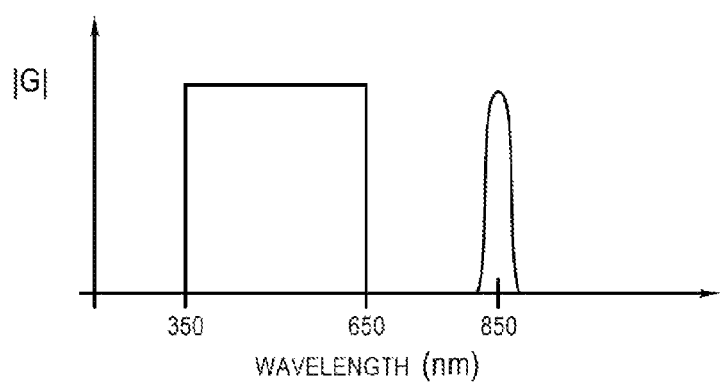
FIG. 4 shows the frequency response for a dual-band filter that can be used in the electronic device of FIG. 3 in accordance with an embodiment of the present invention.

Still referring to FIG. 3, electronic device may also includes filter element such as dual-band filter 50 formed over camera module 12. Dual-hand filter 50 may be configured to pass only visible light and infrared light (or whatever type of light is emitted by non-visible light source 20. An exemplary frequency response of filter 50 is shown in FIG. 4. As shown in FIG. 4, filter 50 may pass through light having wavelengths between 350 nanometers (nm) and 650 nm and light at 850 nm (or alternatively 930 nm).

If desired, fitter 50 may be formed using a pixel color filter array and a dual band filter formed over or below the color filter array. The pixel color filter array may include an array of color filter elements, each of which may be a red filter that passes red light, a blue filter that passes blue light, a green filter that passes green light, a cyan filter that passes cyan light, a magenta filter that passes magenta light, a yellow filter that passes yellow light, or other suitable filters for passing light in the visible spectrum for a corresponding time-of-flight (ToF) image pixel 30. The color filter elements may be arranged in the typical Bayer color filter pattern or other suitable configurations. The dual band filter may only pass visible and infrared light. This is merely illustrative. Other ways of implementing multiband IR cutoff filters (e.g., filters that allow visible light and a range of infrared light) may also be used.

Figure 5:
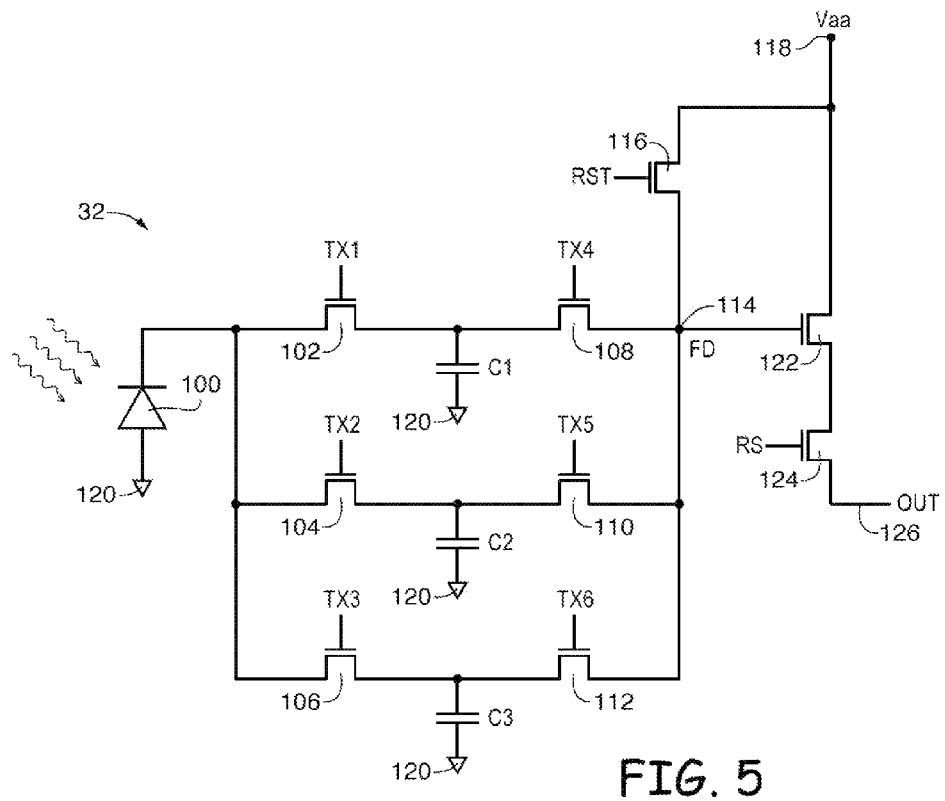
FIG. 5 is a circuit diagram of an illustrative time-of-flight (ToF) pixel in accordance with an embodiment of the present invention.

FIG. 5 is a circuit diagram showing one suitable implementation of time-of-flight pixel 30. As shown in FIG. 5, pixel 30 may include a photosensitive element 100, a first charge transfer transistor 102, a second charge transfer transistor 104, a third charge transfer transistor 106, a first internal memory element C1, a second internal memory element C2, a third internal memory element C3, a fourth charge transfer transistor 108, a fifth charge transfer transistor 110, a sixth charge transfer transistor 112, a floating diffusion 114, a reset transistor 116, a pixel supply voltage terminal 118, a source follower transistor 122, a row select transistor 124, and an output 126. In particular, photosensitive element 100 (e.g., a photodiode) may have a p-type terminal that is connected to a ground line 120 (e.g., a ground power supply line on which a ground power supply voltage signal is provided) and an n-type terminal. The charge transfer transistors may sometimes be referred to-as charge transfer "gates."

Internal memory elements C1, C2, and C3 may be complementary metal-oxide-semiconductor (CMOS) capacitors or diffused diodes (as examples). Capacitor C1 may have a first terminal that is connected to ground line 120 and a second terminal that is coupled to photodiode 100 via charge transfer gate 102 and to floating diffusion 114 via transfer gate 108. Capacitor C2 may have a first terminal that is connected to ground line 120 and a second terminal that is coupled to photodiode 100 via charge transfer gate 104 and to floating diffusion 114 via transfer gate 110. Capacitor C3 may have a first terminal that is connected to ground line 120 and a second terminal that is coupled to photodiode 100 via charge transfer gate 103 and to floating diffusion 114 via transfer gate 112. Capacitors C1, C2, and C3 may be reset to some potential between the pinned potential of photodiode 100 and floating diffusion 114 by asserting pixel supply voltage Vaa on terminal 118 to the desired potential and by asserting control signals RTS, TX4, TX5, and TX6. Floating diffusion 114 may be reset to a potential higher than reset potentials of capacitors C1, C2, and C3 by asserting pixel supply voltage Vaa to the desired high potential and by asserting control signal RST high while keeping control signals TX4, TX5, and TX6 low. Photodiode 100 may receive incoming photos and generate charge in response to receiving the incoming photons. Charges generated by photodiode 100 may be selectively stored in capacitor C1 by turning on first charge transfer gate 102 (e.g., by asserting control signal TX1 high at the gate terminal of transistor 102), in capacitor C2 by turning on second charge transfer gate 104 (e.g., by asserting control signal TX2 high at the gate terminal of transistor 104), and in capacitor C3 by turning on third charge transfer gate 106 (e.g., by asserting control signal TX3 high at the gate of transistor 106). Resetting floating diffusion 114 to high potential may be part of industry known correlated double sampling readout. Charge stored on capacitors C1, C2, and C3 may-be transferred one by one to floating diffusion 114 by asserting high respectfully control signals TX4, TX5, and TX6 to complete correlated double sampling readout via source follower 122, row select transistor 124, and output 126 (e.g. controls signal RS is high during readout and low during light charge acquisition phase).

Figure 6:
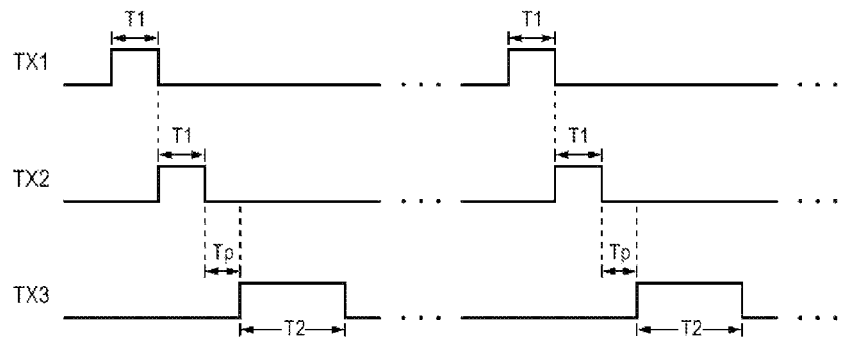
FIG. 6 is a timing diagram showing the behavior of relevant control signals in the ToF pixel of the type shown in FIG. 5 in accordance with an embodiment of the present invention.

FIG. 6 shows how signals TX1, TX2, and TX3 may be controlled during the light acquisition phase. As shown in FIG. 6, control signal TX1 may first be pulsed high for duration T1. The TX1 pulse should be synchronized with the activation of the infrared light illuminator 20 (FIG. 3). In other words, IR light emitter 20 should be turned on for duration T1 only when signal TX1 is asserted. When TX1 is deasserted, IR illuminator 20 should be turned off.

Control signal TX2 should be pulsed high immediately after the TX1 pulse. Control signals TX1 and TX2 should be pulsed high for the same duration (e.g., TX2 should also be pulsed high for T1). Light gathered when TX1 is asserted may include both reflected IR light and backlight light. Light gathered when TX2 is asserted may include any remaining IR light that is being reflected of the scene (IR light should no longer be emitted from device 10 during the pulse of TX2) and background light.

Following the deassertion of TX2, TX3 may be pulsed high for duration T2 after a pause Tp. Pause period Tp between the end of the TX2 pulse and the start of the TX3 pulse may be helpful in suppression any residual contribution from the IR illuminator due to secondary reflections. Charge collected in element C3 when TX3 is pulsed high represents only background information, which can be used to generate color video. The color video may be generated using color pixel extrapolation techniques that are well known in the industry.

Pulse width T2 for control signal TX3 may be same or substantially greater than pulse width T1 associated with control signals TX1 and TX2. In some embodiments, duration T2 may be at least two times longer than T1, at least 10 times longer than T1, at least 100 times longer than T1, etc. As an example, duration T1 may be 200-300 nanoseconds while duration T2 may be two to 30 microseconds or more. As a result, the storage capacity of memory element C3 may be much larger than that of elements C1 and C2 (e.g., the ratio of C3 to C1 and C2 should be proportional to the ratio of T2 to T1). For example, in the scenario in which T2 is two times longer than T1, the capacity of element C3 should be at least two times larger than the capacity of each of elements C1 and C2.

Figure 7:
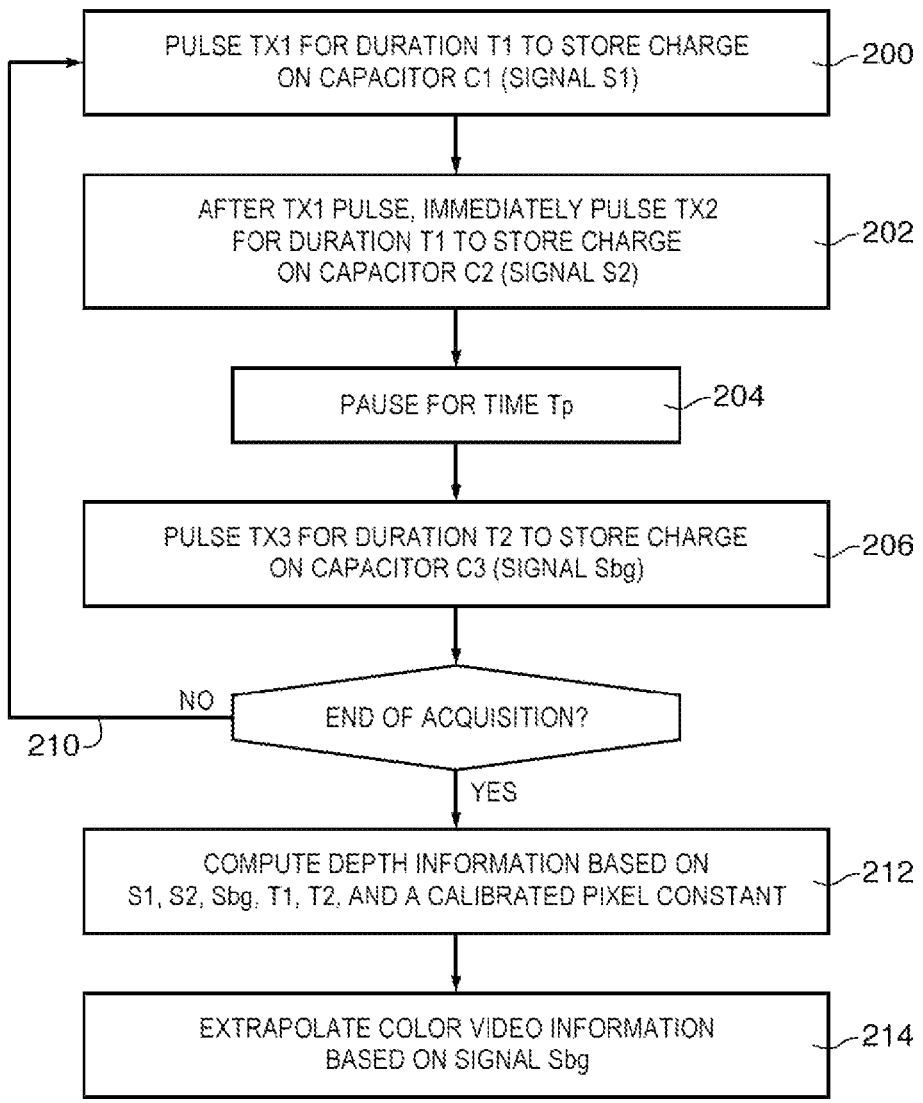
FIG. 7 is a flow chart of illustrative steps involved in operating the ToF pixel of the type shown in FIG. 5 in accordance with an embodiment of the present invention.

This sequence of TX1, TX2, and TX3 pulses may be repeated many times per frame. As an example, this cycle of TX1, TX2, and TX3 may be repeated a few times to thousands of times per frame. FIG. 7 is a flow chart of illustrative steps involved in operating a time-of-flight image sensor pixel of the type described in connection with FIG. 5. At step 200, control signal TX1 may be pulsed high to turn on charge transfer gate 102 for duration T1 to store charge on capacitor C1 (this charge is associated with signal S1). During this time, the non-visible pulse emitter 20 is also turned on.

At step 202, control signal TX2 may be pulsed high immediately after the TX1 pulse to turn on charge transfer gate 104 for duration T1 to store charge on capacitor C2 (this charge is associated with signal S2). During this time, the non-visible pulse emitter 20 should be turned off. Following the deassertion of TX2, there may be a wait period Tp before TX3 is asserted (step 204).

At step 206 following the wait period, control signal TX3 may be pulsed high to activate charge transfer gate 106 for duration T2 to store charge on capacitor C3 (this charge is associated with signal Sbg). Signal Sbg represents only background information. Steps 200, 202, 204, and 206 may be repeated multiple times per image frame, as indicated by return path 210. During each repeated cycle, additional charge may be accumulated on each of capacitors C1, C2, and C3. Signals S1, S2, and Sbg may represent the cumulative signal stored at each of capacitors C1, C2, and C3, respectively, at the end of the acquisition period and may be acquired via correlated double sampling technique known in the industry.

At step 212, storage and processing circuitry 18 (see, FIG. 1) may be used to compute depth information for an $n^{th}$ pixel based on S1, S2, Sbg, T1, T2, and a calibration pixel constant $Pc_n$ according to the following equation:

$$D_n = (S2 - T1/T2 * Sbg)/(S1 - T2*Sbg)*Pc_n$$

As described above, S1 may represent the cumulative signal stored at capacitor C1; S2 may represent the cumulative signal stored at capacitor C2; Sbg may represent the cumulative-signal stored at capacitor C3; T1 may be the duration for which TX1 and TX2 is pulsed high; and T2 may be the duration for which TX3 is pulsed high. Signal Sbg may be multiplied by the ratio of T1 to T2. Weighted differences between S2 and Sbg and between S1 and Sbg may be computed using the ratio of T1/T2 as shown in the equation above. Pixel constant $Pc_n$ may be derived based on a sensor pixel array model that takes into account delays within the image pixel circuitry and the speed of light and may also be extracted using per pixel calibration operations. Per pixel calibration may produce relatively accurate results since it takes into account the delay associated with each specific pixel 30.

At step 214, Sbg may be used to extrapolate color video information using well known color extrapolation techniques.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Figure 8:
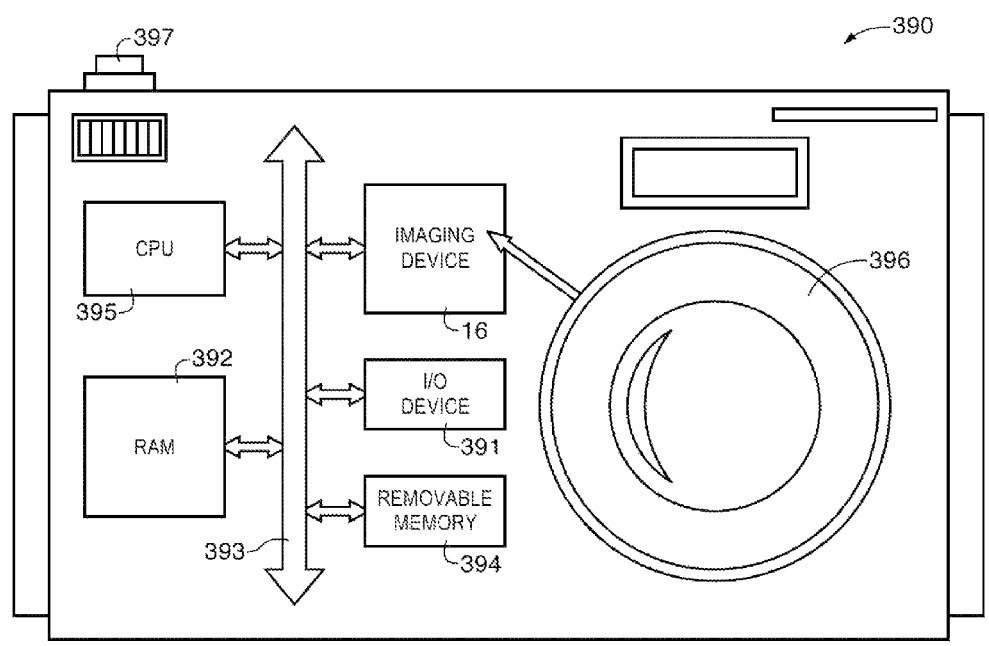
FIG. 8 is a block diagram of a processor system that may employ some of the embodiments of FIGS. 1-7 in accordance with an embodiment of the present invention.

FIG. 8 shows, in simplified form, a typical processor system 390. Processor system 390 is exemplary of a system having digital circuits that include imaging device 16 having time-of-flight image sensor pixels of the type described in connection with FIGS. 3-7. Without being limiting, such a system could include a computer system, still or video camera system, scanner, machine vision, vehicle navigation, video phone, surveillance system, auto focus system, star tracker system, motion detection system, image stabilization system, video gaming system, video overlay system, and other systems employing an imaging device.

Processor system 390, which may be a digital still or video camera system, may include a lens such as dens 396 for focusing an image onto a pixel array such as pixel array 20 when shutter release button 307 is pressed. Processor system 390 may include a central processing unit such as central processing unit (CPU) 395. CPU 395 may be a microprocessor that controls camera functions and one or more image flow functions and communicates with one or more input/output (I/O) devices 391 over a bus such as bus 393. imaging device 16 may also communicate with CPU 395 over bus 393. System 390 may include random access memory (RAM) 392 and removable memory 394. Removable memory 394 may include flash memory that communicates with CPU 395 over bus 393. Imaging device 16 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating electronic devices that include time-of-flight image pixels configured to measure the time of flight of an emitted light pulse for sensing distance information about objects in a scene. Emitted light pulses may be generated by an infrared light emitter on the electronic device and reflected from objects in the field-of-view of the time-of-flight image pixels. Time-of-flight image pixels may be configured to measure relative differences in time-of-flight between reflected portions of emitted light pulses. Time-of-flight image sensors may be configured to remove background light of reflected portions of emitted light pulses.

A time-of-flight image pixel may include a photodiode, a first storage element that is coupled to the photodiode via a first charge transfer transistor, a second storage element that is coupled to the photodiode via a second charge transfer transistor, and a third storage element that is coupled to the photodiode via a third charge transfer transistor. The first, second, and third charge transistors may receive first, second, and third control signals, respectively.

The first storage element may receive charge generated at least partially from light emitted from the infrared emitter while the infrared emitter is activated. The second storage element may receive charge generated at least partially from light emitted from the infrared emitter while the infrared emitter is deactivated. The third storage element may receive charge generated only-from background light in a scene while the infrared emitter is deactivated.

Charge may be transferred to the first and second storage elements by asserting the first and second control signals, respectively. The first and second control signals may be pulsed high for a first duration. Similarly, charge may be transferred to the third storage element by asserting the third control signal. The third control signal may be pulsed high for a second duration that is same or longer than the first duration. As a result, the third storage element may have a storage capacity that is bigger than that of each of the first and second storage elements. The second control signal may be pulsed immediate after the first control signal pulse. The third control signal may be pulsed after a predetermined wait time Following the second control signal pulse.

The electronic device may also include processing circuitry configured to compute depth information based on the charges stored in the first, second, and third storage elements and a predetermined, pixel constant associated with each pixel. A dual-band filter may be formed on top of the ToF image pixels to pass at least some visible light and at least some non-visible (infrared) light. This allows the processing circuitry to obtain color video information based only on charge stored in the third storage element.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor for imaging a scene having at least some background light, comprising:
   a non-visible light emitter that emits non-visible light; and
   a time-of-flight (ToF) image pixel, comprising:
      a floating diffusion node;
      a photosensitive element;
      a first storage element coupled between the floating diffusion node and the photosensitive element that receives charge generated at least partially from reflected portions of the non-visible light; and
      a second storage element coupled between the floating diffusion node and the photosensitive element that receives charge generated only from the background light.

2. The image sensor defined in claim 1, wherein the non-visible light emitter comprises an infrared pulse emitter.

3. The image sensor defined in claim 1, wherein the first and second storage elements comprise capacitors.

4. The image sensor defined in claim 1, wherein the time-of-flight image pixel further includes:
   a third storage element that receives charge generated at least partially from the reflected emitter non-visible light;
   a first charge transfer gate coupled between the first storage element and the photosensitive element;
   a second charge transfer gate coupled between the second storage element and the photosensitive element; and
   a third charge transfer gate coupled between the third storage element and the photosensitive element.

5. The image sensor defined in claim 4, further comprising:
   a first control line on which a first control signal that controls the first charge transfer gate is provided;
   a second control line on which a second control signal that controls the second charge transfer gate is provided; and
   a third control line on which a third control signal that controls the third charge transfer gate is provided.

6. The image sensor defined in claim 5, wherein the second storage element has a storage capacity that is at bigger than that of the first storage element, wherein the first control signal is pulsed high for a first duration, wherein the third control signal is pulsed high for the first duration, and wherein the second control signal is pulsed high for a second duration that is longer than the first duration.

7. The image sensor defined in claim 1, further comprising:
   processing circuitry operable to compute depth information based on charges stored in the first and second storage elements.

8. The image sensor defined in claim 1, further comprising:
   a dual-band filter-formed on top of the time-of-flight image pixel, wherein the dual-band filter passes at least some visible light and at least some non-visible light.

9. A method of operating an image sensor that includes a non-visible light emitter and a time-of-flight (ToF) Image pixel the method comprising:
   while the non-visible light emitter is activated, transferring charge to a first memory element in the time-of-flight image pixel;
   while the non-visible light emitter is deactivated, transferring charge to a second memory element in the time-of-flight image pixel; and
   while the non-visible light emitter is deactivated, transferring charge to a third memory element in the time-of-flight image pixel immediately after transferring charge to the first memory element, wherein transferring charge to the second memory element occurs after a predetermined wait time following the transfer of charge to the third memory element.

10. The method-defined in claim 9, wherein:
    the time-of-flight image pixel further includes a photodiode;
    transferring the charge to the first memory element comprises asserting a first control signal for a first duration to turn on a first charge transfer gate coupled between the photodiode and the first memory element;
    transferring the charge to the second memory element comprises asserting a second control signal for a second duration that is different than the first duration to turn on a second charge transfer gate coupled between the photodiode and the second memory element; and
    transferring the charge to the third memory element comprises asserting a third control signal for the first duration to turn on a third charge transfer gate coupled between the photodiode and the third memory element.

11. The method defined in claim 10, wherein the second duration is longer than the first duration.

12. The method defined in claim 10, further comprising:
    retrieving a pixel constant associated with the time-of-flight image pixel; and
    computing depth information based on the retrieved pixel constant and the charges stored in the first, second, and third memory elements.

13. The method defined in claim 12, wherein computing the depth information comprises computing a ratio of the first duration to the second duration and computing a-weighted difference between the charges stored in the second and third memory elements and between the charges stored in the first and second memory elements.

14. A system, comprising:
    a central processing unit;
    memory;
    a lens;
    input-output circuitry; and
    an imaging device for imaging a scene having at least some backlight light, comprising:
       an infrared illuminator that emits infrared light;
       a time-of-flight (ToF) pixel that includes a first storage element for receiving charge generated while the infrared illuminator is activated, a second storage element for receiving charge generated while the infrared illuminator is deactivated, and a third storage element for receiving charge generated while the infrared illuminator is deactivated, wherein the charge received by the third storage element corresponds only to charge generated by the background light; and
       processing circuitry configured to compute depth information based on charges stored in the first, second, and third storage elements and further configured to obtain color video information based only on charge stored in the third storage element.

15. The system defined in claim 14, wherein the first storage element has a storage capacity that is equal to that of the second storage element and that is smaller than that of the third storage element.

16. The system defined in claim 14, wherein the time-of-flight pixel further includes:
    a photodiode;
    a first transistor interposed between the first storage element and the photodiode;
    a second transistor interposed between the second storage element and the photodiode; and a third transistor Interposed between the third storage element and the photodiode, wherein the first and second transistors receive pulse control signals having a given pulse width, and wherein the third transistor receives another pulse control signal having a pulse width that is longer than the given pulse width.

17. The system defined in claim 14, further comprising:
a dual-band filter formed over the imaging device.

* * * * *